United States Patent
Seike et al.

(10) Patent No.: US 11,431,256 B2
(45) Date of Patent: Aug. 30, 2022

(54) POWER CONVERSION DEVICE

(71) Applicant: Mitsubishi Electric Corporation, Tokyo (JP)

(72) Inventors: Kohei Seike, Tokyo (JP); Ryohei Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 74 days.

(21) Appl. No.: 17/026,410

(22) Filed: Sep. 21, 2020

(65) Prior Publication Data

US 2021/0152098 A1 May 20, 2021

(30) Foreign Application Priority Data

Nov. 20, 2019 (JP) .............................. JP2019-209410

(51) Int. Cl.
*H02M 7/00* (2006.01)
*H05K 5/06* (2006.01)
*H05K 5/02* (2006.01)
*H02M 7/42* (2006.01)

(52) U.S. Cl.
CPC ............ *H02M 7/003* (2013.01); *H05K 5/061* (2013.01); *H02M 7/42* (2013.01); *H05K 5/0239* (2013.01)

(58) Field of Classification Search
CPC ...... H02M 7/003; H02M 7/42; H05K 5/0239; H05K 5/061
See application file for complete search history.

(56) References Cited

U.S. PATENT DOCUMENTS

2014/0294628 A1* 10/2014 Yano .................. F04C 18/0215
417/410.5

FOREIGN PATENT DOCUMENTS

| JP | 2011-166981 A | | 8/2011 |
| JP | 2013-097946 A | | 5/2013 |
| JP | 2013097946 A | * | 5/2013 |
| JP | 2015-074015 A | | 4/2015 |

OTHER PUBLICATIONS

Communication dated Jan. 6, 2021 from the Japanese Patent Office in Application No. 2019-209410.

* cited by examiner

*Primary Examiner* — Jue Zhang
(74) *Attorney, Agent, or Firm* — Sughrue Mion, PLLC; Richard C. Turner

(57) ABSTRACT

Provided is a power conversion device that has improved assembling workability and that realizes downsizing thereof. The power conversion device includes: an electrical component; a casing enclosing the electrical component and terminals connected to the electrical component and an outside, the casing having a plurality of opening portions in which the terminals are disposed; and a casing lid covering the opening portions. A shaft seal provided so as to be in contact with a side surface contiguous with a rim of an opening portion among the opening portions, and a surface seal provided so as to be in contact with a surface contiguous with a rim of an opening portion among the opening portions, are disposed so as to be in contact with the casing lid.

14 Claims, 11 Drawing Sheets

POWER CONVERSION DEVICE

BACKGROUND OF THE INVENTION

1. Field of the Invention

The present disclosure relates to a power conversion device.

2. Description of the Background Art

A plurality of power conversion devices are mounted to electric vehicles using a motor as a drive source, such as electric automobiles and hybrid automobiles. Examples of the power conversion devices include: a commercially-available charger for converting AC power into DC power and charging a high-voltage battery; a DC/DC converter for converting DC power of the high-voltage battery into voltage (for example, 12V) for an auxiliary device battery; an inverter for converting DC power from the battery into AC power for the motor; and the like.

In a casing of each power conversion device, a plurality of terminals are disposed as to-be-connected portions for receiving power supplied from an outside and for outputting AC current to the outside. The terminals are, for example, a current outputting terminal and a motor control signal connector. As structures for connecting a motor terminal and a signal connector to these terminals, a structure for fastening the terminal by means of bolts from outside the casing and a structure for fitting the connector are provided in the casing. The casing has: an opening through which a bolt fastening tool is inserted into the casing and work is performed; and an opening through which work for fitting the connector is performed. In order to prevent water, dust, and the like from entering the casing from these openings, waterproof casing lids for covering the openings are attached to the casing after the bolts are fastened and the connector is fitted.

In recent years, the structures of in-vehicle inverters have been complicated. Thus, power conversion devices have structures in which a plurality of openings are formed in casings thereof. Therefore, a waterproof casing lid needs to be attached for each of the plurality of formed openings. In order to improve workability of attaching the casing lids, casing lids capable of being easily attached for the plurality of openings have been required. As a measure to easily close a plurality of openings, a structure has been disclosed in which a plurality of openings are in communication with one another so as to be formed as one opening portion, and one casing lid is attached for the openings in communication with one another, thereby achieving waterproofness (see, for example, Patent Document 1).

Patent Document 1: Japanese Laid-Open Patent Publication No. 2011-166981

In the above-described Patent Document 1, since the plurality of openings are in communication with one another so as to be formed as one opening portion, the openings can be covered to achieve waterproofness by attaching the one casing lid, whereby workability is improved. However, since the plurality of openings are in communication with one another, the shape of a seal for achieving waterproofness is complicated, and thus a surface seal needs to be used as a waterproof seal structure.

If the surface seal structure is employed for the openings in communication with one another, the following problem arises. The surface area of the casing is increased for providing the surface seal, and thus the layout of the internal structure of the power conversion device is restricted, and the casing and also the power conversion device is upsized. In addition, if the surface seal structure is employed, the following problem also arises. When the casing lid is attached to the casing, the casing lid cannot be retained by the surface seal, and thus the casing lid has to be supported at the time of fastening bolts for attaching the casing lid to the casing, and furthermore, the number of bolts to be fastened is increased for ensuring sealability, whereby workability of attaching the casing lid becomes poor.

SUMMARY OF THE INVENTION

The present disclosure has been made to solve the aforementioned problems, and an object of the present disclosure is to obtain a power conversion device that has improved assembling workability and that realizes downsizing thereof.

A power conversion device according to the present disclosure includes: an electrical component; a casing enclosing the electrical component and terminals connected to the electrical component and an outside, the casing having a plurality of opening portions in which the terminals are disposed; and a casing lid covering the opening portions. A shaft seal provided so as to be in contact with a side surface contiguous with a rim of an opening portion among the opening portions, and a surface seal provided so as to be in contact with a surface contiguous with a rim of an opening portion among the opening portions, are disposed so as to be in contact with the casing lid.

In the power conversion device according to the present disclosure, the different seals are in contact with the one casing lid, and thus the power conversion device has improved assembling workability and can realize downsizing thereof.

DETAILED DESCRIPTION OF THE PREFERRED EMBODIMENTS OF THE INVENTION

Figure 1:
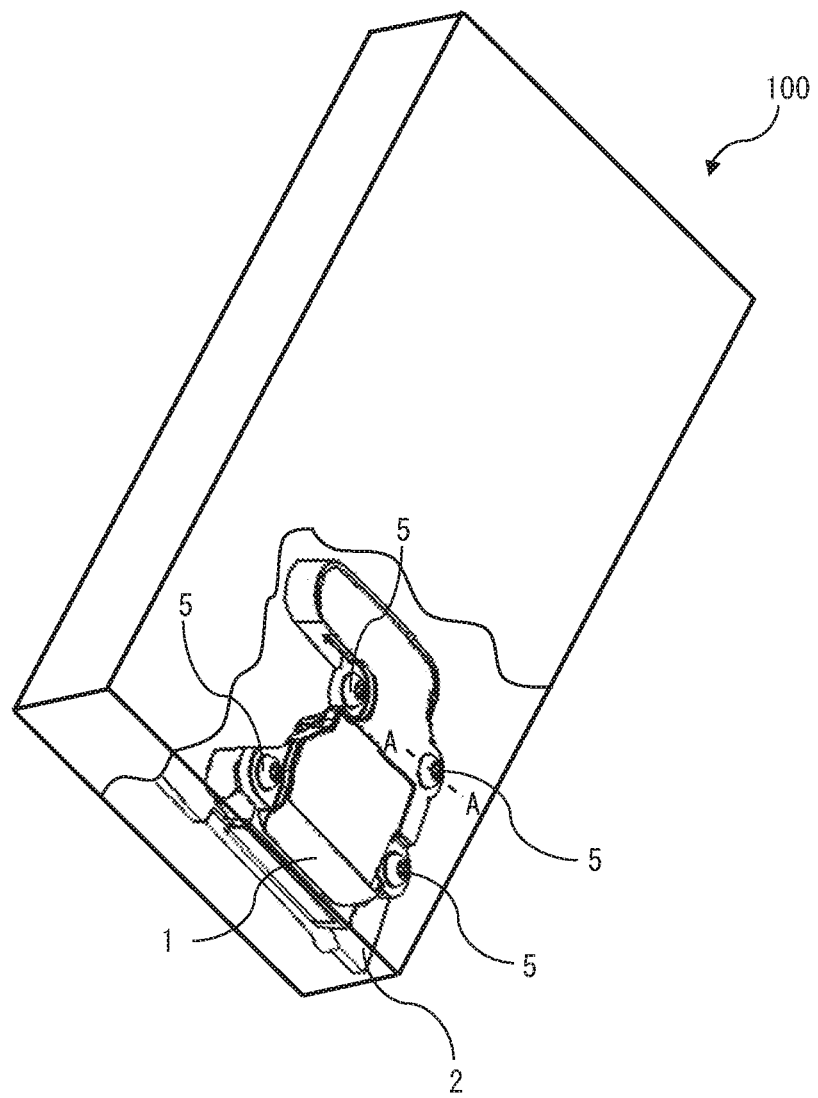
FIG. 1 is a perspective view of the outer appearance of a power conversion device according to a first embodiment.

Hereinafter, power conversion devices according to embodiments of the present disclosure will be described with reference to the drawings. In the description, identical and corresponding members and portions in the drawings will be denoted by the same reference characters.

First Embodiment

Figure 2:
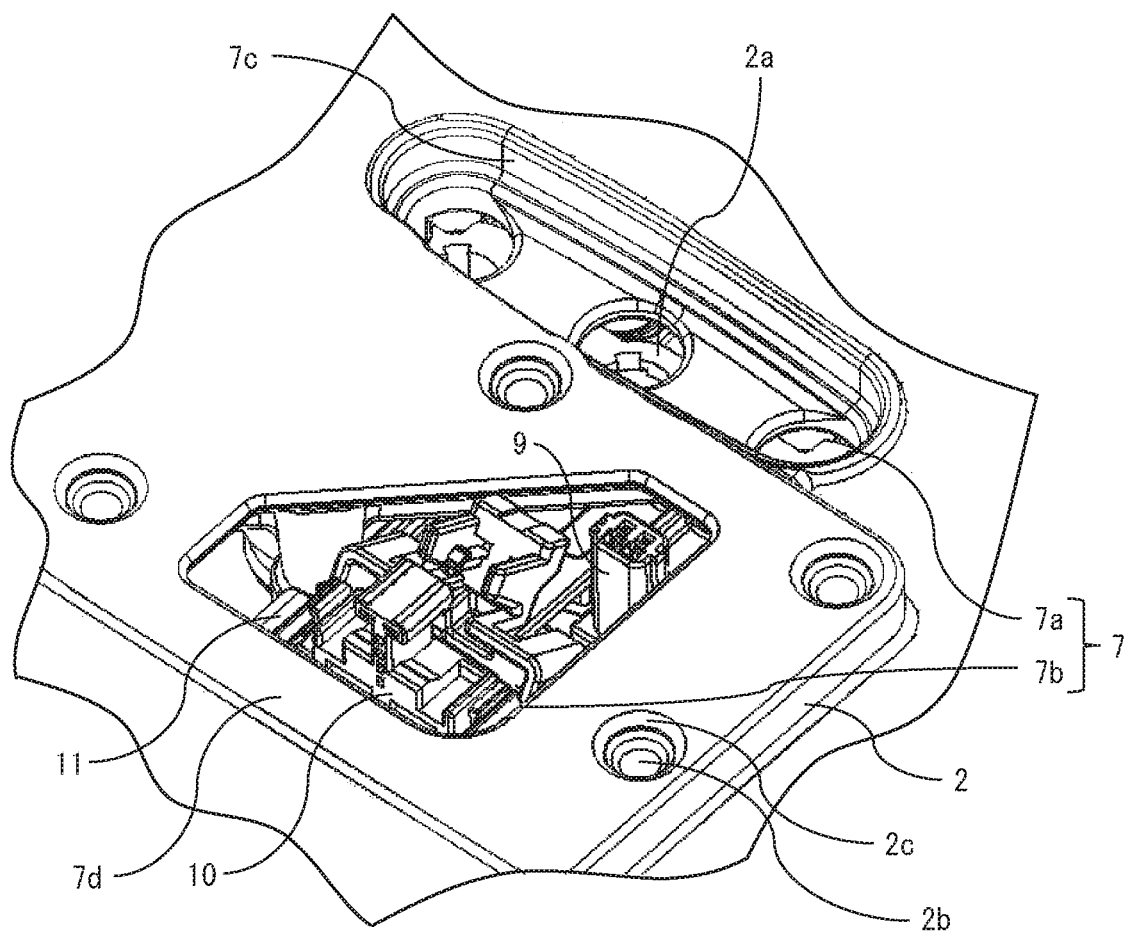
FIG. 2 is an enlarged perspective view of opening portions of the power conversion device according to the first embodiment.
Figure 3:
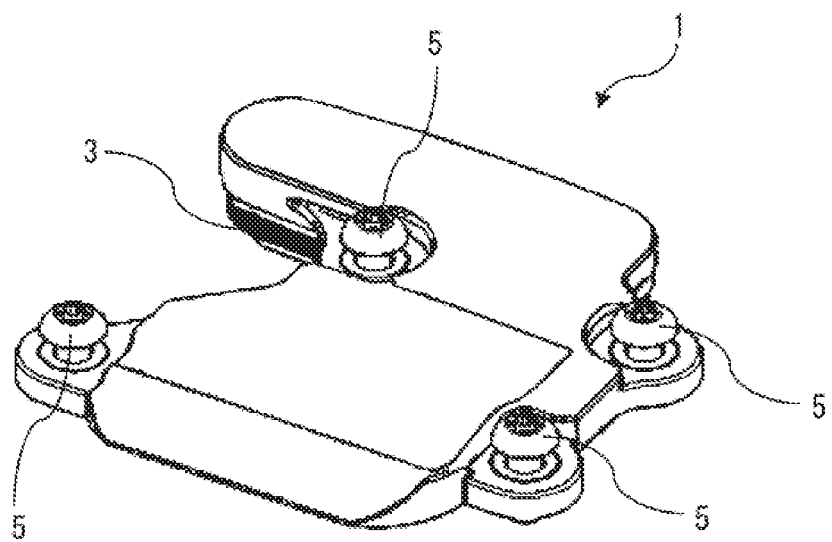
FIG. 3 is a perspective view of the outer appearance of a casing lid of the power conversion device according to the first embodiment.
Figure 4:
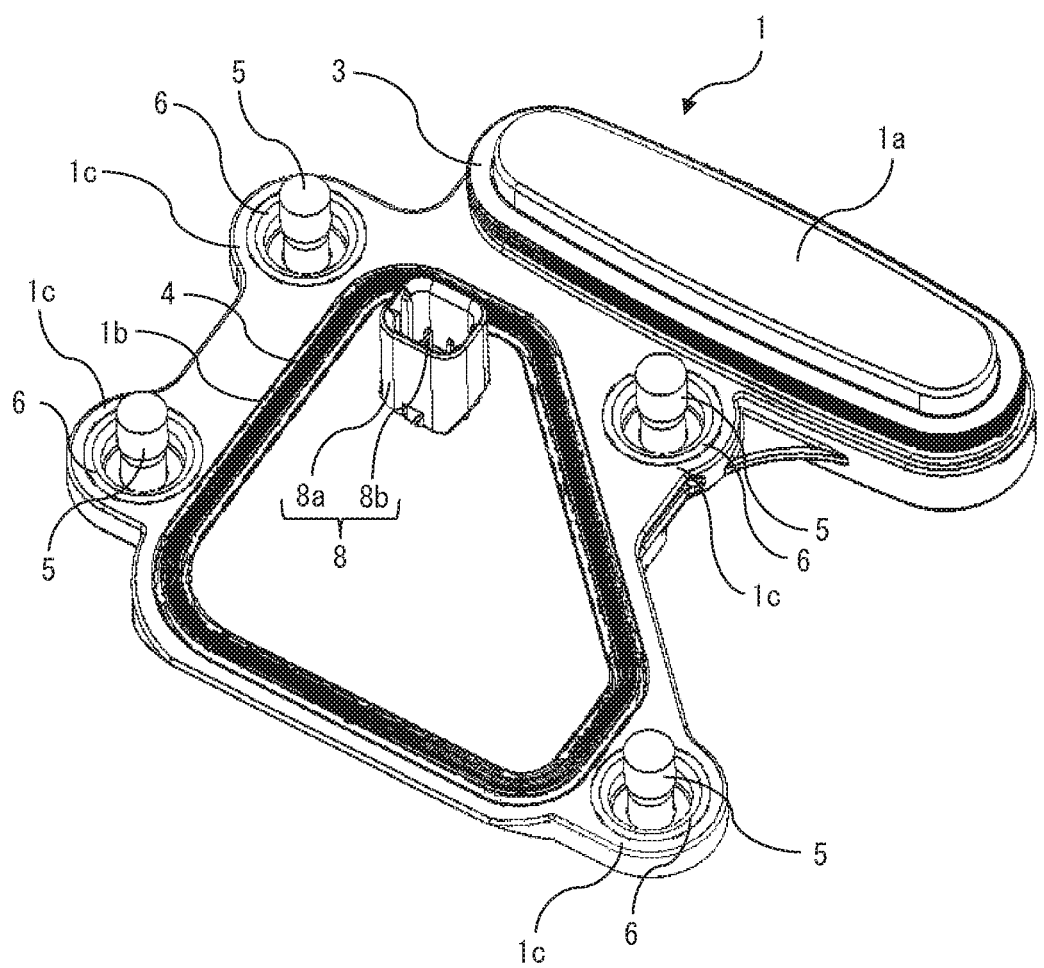
FIG. 4 is another perspective view of the outer appearance of the casing lid of the power conversion device according to the first embodiment.
Figure 5:
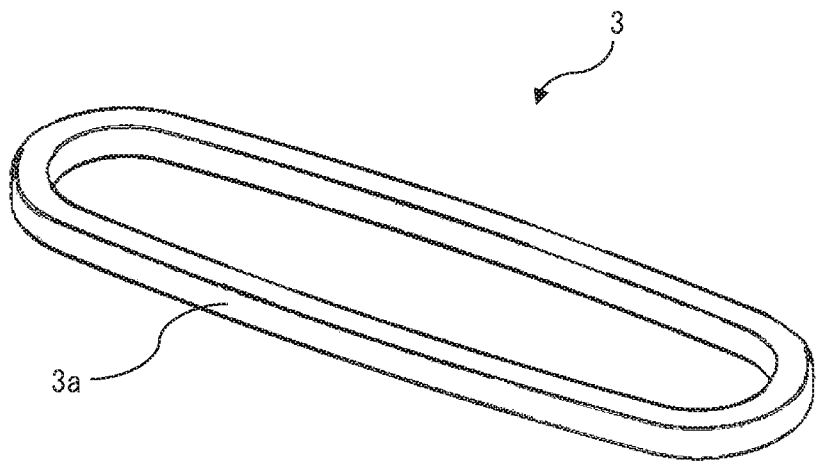
FIG. 5 is a perspective view of the outer appearance of a shaft seal of the power conversion device according to the first embodiment.
Figure 6:
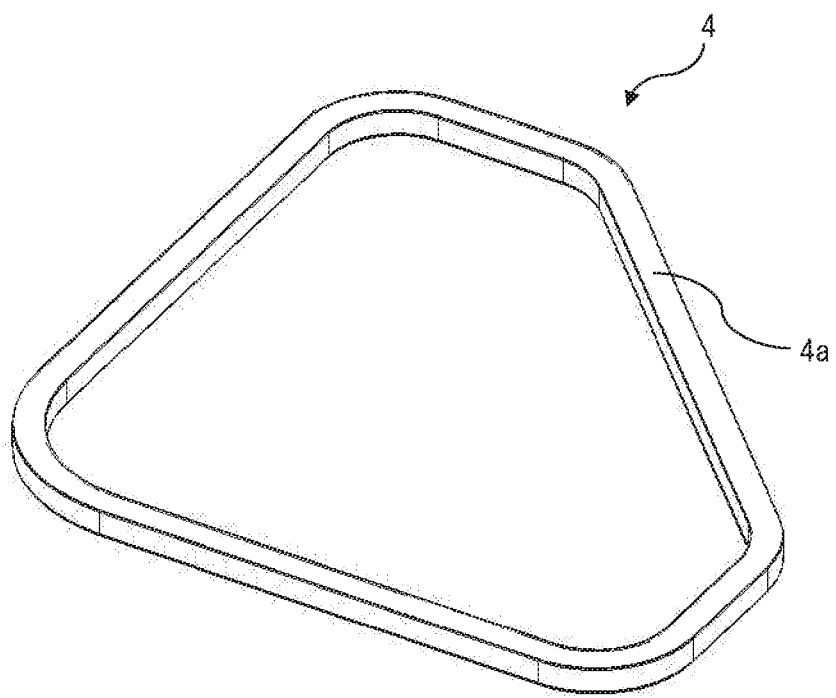
FIG. 6 is a perspective view of the outer appearance of a surface seal of the power conversion device according to the first embodiment.
Figure 7:
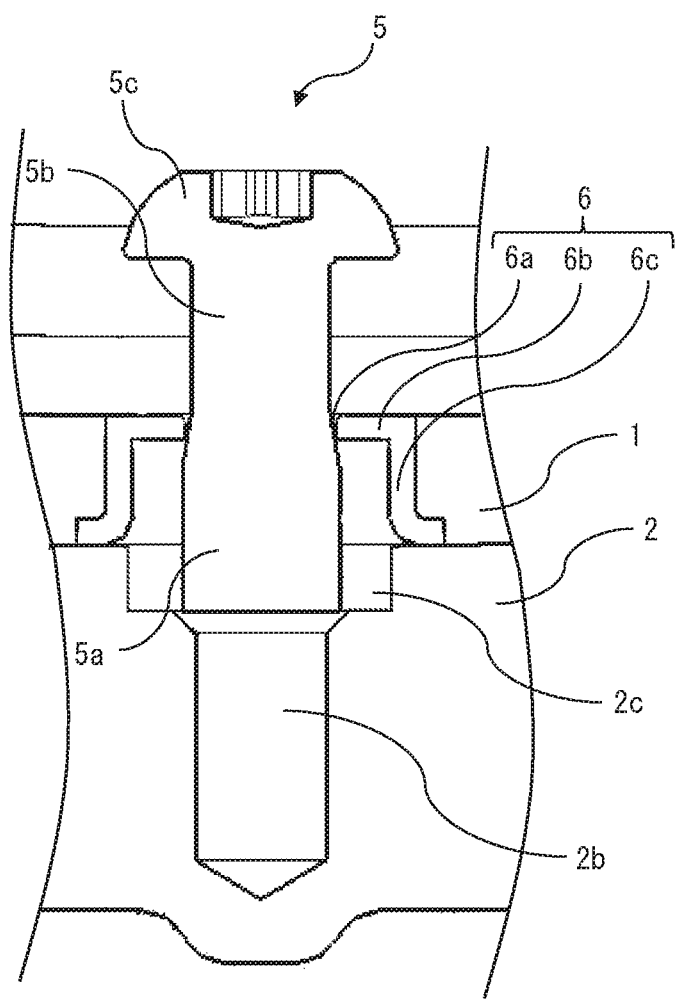
FIG. 7 is a sectional view taken along the alternate long and short dash line A-A in FIG. 1.

FIG. 1 is a perspective view of the outer appearance of a power conversion device 100 according to a first embodiment. FIG. 2 is an enlarged perspective view of opening portions 7, with a casing lid 1 being removed from the power conversion device 100. FIG. 3 is a perspective view of the outer appearance of the casing lid 1 of the power conversion device 100. FIG. 4 is another perspective view of the outer appearance of the casing lid 1, as seen from the back side of FIG. 3. FIG. 5 is a perspective view of the outer appearance of a shaft seal 3. FIG. 6 is a perspective view of the outer appearance of a surface seal 4. FIG. 7 is a sectional view taken along the alternate long and short dash line A-A in FIG. 1 before screws 5 are fastened. The power conversion device 100 is a device for converting power, which has been supplied from a power supply, into a predetermined AC voltage and supplying the AC voltage to a load. The load is, for example, a motor. The power conversion device 100 includes an electrical component (not shown), a casing 2, and the casing lid 1. The casing lid 1 shown in FIG. 3 is attached to the casing 2 by means of four screws 5 as shown in FIG. 1.

The casing 2 encloses the electrical component and terminals connected to the electrical component and an outside. As shown in FIG. 2, the casing 2 has two opening portions 7 in which the terminals are disposed. The opening portions 7 are a shaft seal opening portion 7a and a surface seal opening portion 7b. On the shaft seal opening portion 7a side, an AC load terminal 2a is provided as a terminal to be connected to the outside. The shaft seal opening portion 7a is an opening portion for performing connection work when connecting the AC load terminal 2a and the outside to each other. On the back side of the casing 2, the AC load terminal 2a is in communication with the outside. On the surface seal opening portion 7b side, a signal wire female connector 10 is provided as a terminal to be connected to the outside. The surface seal opening portion 7b is an opening portion for performing connection work when connecting the signal wire female connector 10 and the outside to each other. On the back side of the casing 2, the signal wire female connector 10 is in communication with the outside. Before the connection work, the signal wire female connector 10 is retained by a signal wire female connector retaining portion 11. During the connection work, the signal wire female connector 10 is moved in a direction toward the back side of the casing 2, and the signal wire female connector 10 is connected to the outside. After the connection work, the signal wire female connector 10 is detached from the signal wire female connector retaining portion 11. FIG. 2 shows the inside of the surface seal opening portion 7b before the connection work, and the signal wire female connector 10 is retained by the signal wire female connector retaining portion 11. The shaft seal 3 shown in FIG. 5 is provided so as to be in contact with a side surface 7c contiguous with the rim of the shaft seal opening portion 7a. The surface seal 4 shown in FIG. 6 is provided so as to be in contact with a surface seal mounting surface 7d which is a surface contiguous with the rim of the surface seal opening portion 7b. As shown in FIG. 4, the shaft seal 3 and the surface seal 4 are attached to a side of the casing lid 1 on which the opening portions 7 are covered. In the power conversion device 100, the shaft seal 3 and the surface seal 4 are disposed so as to be in contact with the casing lid 1. As shown in FIG. 1, the two opening portions 7 are covered by the casing lid 1 after the connection work using each opening portion 7. The terminals provided in the opening portions 7 are not limited to the AC load terminal 2a and the signal wire female connector 10, and may be each, for example, a DC load terminal or a terminal to be connected to another load.

The casing lid 1 which is a major part of the present disclosure will be described. The casing lid 1 is formed by, for example, resin molding. As shown in FIG. 4, the casing lid 1 includes the shaft seal 3, the surface seal 4, the screws 5, bushes 6, and an interlock connector 8. The casing lid 1 includes the two different types of seals. The shaft seal 3 is provided so as to be fitted to a projecting shaft seal mounting portion 1a, and the surface seal 4 is provided so as to be fitted to a recessed surface seal mounting portion 1b. The casing lid 1 covers the shaft seal opening portion 7a via the shaft seal 3, to achieve waterproofness. The casing lid 1 covers the surface seal opening portion 7b via the surface seal 4, to achieve waterproofness. As shown in FIG. 5, the shaft seal 3 is, in a plan view, formed into a laterally elongated rectangle having round corners, and is, at a side surface 3a thereof, in contact with the side surface 7c of the shaft seal opening portion 7a. As shown in FIG. 6, the surface seal 4 is, in a plan view, formed into a pentagon so as to be fitted along the outer shape of the surface seal opening portion 7b, and is, at a flat surface 4a thereof, in contact with the surface seal mounting surface 7d surrounding the surface seal opening portion 7b. The shaft seal 3 and the surface seal 4 are made of, for example, nitrile rubber.

In the case of an opening portion having a complicated outer shape such as the surface seal opening portion 7b, the surface seal 4 is provided as a seal structure. Meanwhile, in the case of an opening portion having an uncomplicated outer shape such as the shaft seal opening portion 7a, the shaft seal 3 can be used as a seal structure. In the case where the shaft seal 3 is used, no surface surrounding the opening portion such as the surface seal mounting surface 7d is needed, and the size of the seal structure can be reduced, whereby the casing 2 and also the power conversion device 100 can be downsized. In addition, when the casing lid 1 is attached to the casing 2, the shaft seal 3 is fitted to the shaft seal opening portion 7a first, whereby the position of the casing lid 1 is uniquely determined relative to the casing 2, and the casing lid 1 can be temporarily fixed. Therefore, the casing lid 1 can be fixed to the casing 2 by means of the screw 5 without supporting the casing lid 1 with a hand. Since the one casing lid 1 includes the two different types of seals, workability is improved, and the time for assembling work can be shortened.

The metallic bushes 6 each made by, for example, metal sheet deep drawing are integrated with bush insert molding portions 1c of the casing lid 1. As shown in FIG. 7, each bush 6 is composed of: a hole 6a through which the corresponding screw 5 is inserted; a level portion 6b surrounding the hole 6a; and a side surface portion 6c surrounding the outer periphery of the level portion 6b. The screws 5 for attaching the casing lid 1 to the casing 2 are disposed only around the surface seal 4. The screws 5 are thus arranged since a surface pressure for pressing the surface seal 4 against the surface seal mounting surface 7d needs to be applied to the surface seal 4. No screws 5 need to be arranged around the shaft seal 3 since the shaft seal 3 is provided so as to be fitted to the side surface 7c of the shaft seal opening portion 7a. As shown in FIG. 7, each screw 5 is, at a non-rolled portion 5b thereof between a rolled portion 5a of the screw 5 and a head portion 5c of the screw 5, retained in the hole 6a of the corresponding bush 6. The diameter of the hole 6a is larger than the outer diameter of the non-rolled portion 5b of the screw 5 but smaller than the outer diameter of each of the rolled portion 5a and the head portion 5c. Therefore, the casing lid 1 can retain the screw 5 without the screw 5 falling off from the bush 6. The bush 6 is formed of, for example, an aluminum alloy having a lower hardness than the screw 5 formed of iron. Therefore, the rolled portion 5a of the screw 5 can be screwed so as to be inserted through the bush 6 while tapping the bush 6. Accordingly, the bush 6 can be held between the rolled portion 5a and the head portion 5c, of the screw, which each have an outer diameter larger than the diameter of the hole 6a.

As shown in FIG. 7, the casing 2 is provided with internal thread portions 2b in each of which the corresponding screw 5 is fastened. The casing 2 is, at a portion thereof contiguous with each internal thread portion 2b, provided with a counterbore 2c to which the rolled portion 5a is fitted. The rolled portion 5a of the screw 5 is formed such that the length thereof is smaller than the total of the height of the side surface portion 6c of the bush 6 and the depth of the counterbore 2c. Therefore, the casing lid 1 can be temporarily fixed to the casing 2 without the casing lid 1 being tilted relative to the casing 2, before the screw 5 and the internal thread portion 2b are fastened to each other. Accordingly, the screw 5 can be fastened without supporting the casing lid 1 with a hand in a state where the screw 5 is retained. Thus, workability is improved, and the time for assembling work can be shortened.

As shown in FIG. 4, the casing lid 1 includes the interlock connector 8 to be engaged with an interlock female connector 9 (shown in FIG. 2) provided in the surface seal opening portion 7b. The interlock connector 8 includes terminals 8b provided in the interlock connector 8, and a housing portion 8a enclosing the terminals 8b. The housing portion 8a is formed by resin molding so as to be integrated with the casing lid 1. The terminals 8b are insert-molded into the casing lid 1. Presence or absence of the casing lid 1 can be determined by detecting connection between the terminals 8b and terminals provided to the interlock female connector 9. Since the housing portion 8a is integrated with the casing lid 1, the number of components can be reduced. However, the configuration of the interlock connector 8 is not limited to this configuration. For example, a separately formed interlock connector 8 may be engaged with a nut that is insert-molded into the casing lid 1.

Since the casing lid 1 is formed by resin molding, the weight of the casing lid 1 can be reduced. However, the method for forming the casing lid 1 is not limited to resin molding. For example, the casing lid 1 may be formed by metal sheet press working or aluminum die-casting. If the casing lid 1 is formed by metal sheet press working, the casing lid 1 can be formed at low cost. In addition, the shape of each bush 6 can be simultaneously formed on the casing lid 1 during metal sheet press working, and thus the number of components can be reduced. Meanwhile, if the casing lid 1 is formed by aluminum die-casting, the strength of the material can be increased, and the weight of the casing lid 1 can be reduced. In addition, the shape of the bush 6 can be simultaneously formed on the casing lid 1 during aluminum die-casting, and thus the number of components can be reduced.

Since each bush 6 is formed by metal sheet deep drawing, a structure for retaining the screw 5 can be easily formed at low cost. However, the method for forming the bush 6 is not limited to metal sheet deep drawing. For example, the bush 6 may be formed by machining or forging. If the bush 6 is formed by machining, a material that cannot be formed by metal sheet deep drawing can be used for the bush 6. Accordingly, the degree of freedom in materials that can be selected is increased, thereby enabling increase in the strength of the material, weight reduction, or the like. Meanwhile, if the bush 6 is formed by forging, the bush 6 can be formed at low cost.

Since the bush 6 is made of an aluminum alloy, the bush 6 has high corrosion resistance and does not need to be plated, and the weight thereof can be reduced. However, the raw material of the bush 6 is not limited to aluminum alloy. The raw material of the bush 6 only has to have a hardness lower than the hardness of the screw 5.

As described above, in the power conversion device 100 according to the first embodiment, the seals respectively provided along the peripheries of the plurality of opening portions 7 of the casing 2 are the shaft seal 3 and the surface seal 4 which are in contact with the casing lid 1 covering the opening portions 7. Thus, since the different seals are in contact with the one casing lid 1, workability of assembling the power conversion device 100 is improved, and downsizing of the power conversion device 100 can be realized. In addition, in the case where the terminal in the shaft seal opening portion 7a provided with the shaft seal 3 is the AC load terminal 2a, the connection work for the AC load terminal 2a which is a high-current terminal is performed by fastening screws with use of a tool. Accordingly, the shape of the opening portion can be simplified, and the shaft seal 3 can be used as a seal for the opening portion. In addition, in the case where each screw 5 for attaching the casing lid 1 to the casing 2 is retained by the corresponding bush 6 at the non-rolled portion 5b between the rolled portion 5a of the screw 5 and the head portion 5c of the screw 5, the screw 5 can be retained by the casing lid 1 while the screw 5 is prevented from falling off from the bush 6. In addition, since the screw 5 is retained by the casing lid 1, the work of screwing the screw 5 into the corresponding internal thread portion 2b through the casing lid 1 is not needed, and the workability of assembling the power conversion device 100 can be improved. In addition, in the case where the screws 5 are arranged around the surface seal 4, no screws 5 are needed around the shaft seal 3, and thus downsizing of the power conversion device 100 can be realized. In addition, in the case where, for the internal thread portion 2b which is formed in the casing 2 and to which the rolled portion 5a is to be fastened, the counterbore 2c to which the rolled portion 5a is fitted is provided at the portion contiguous with the internal thread portion 2b, the casing lid 1 can be temporarily fixed to the casing 2 without the casing lid 1 being tilted relative to the casing 2, before the screw 5 and the internal thread portion 2b are fastened to each other. Accordingly, the screw 5 can be fastened without supporting the casing lid 1 with a hand in a state where the screw 5 is retained. Thus, the workability of assembling the power conversion device 100 is improved, and the time for the assembling work can be shortened. In addition, in the case where the casing lid 1 includes the interlock connector 8 to be engaged with the interlock female connector 9 provided in the surface seal opening portion 7b, presence or absence of the casing lid 1 to be provided to the power conversion device 100 can be easily determined. In addition, in the case where the housing portion 8a of the interlock connector 8 is formed by resin molding so as to be integrated with the casing lid 1, the number of components can be reduced, and the workability of assembling the power conversion device 100 is improved. In addition, in the case where the terminals 8b of the interlock connector 8 are insert-molded into the casing lid 1, the workability of assembling the power conversion device 100 is improved, and the time for the assembling work can be shortened.

Second Embodiment

Figure 8:
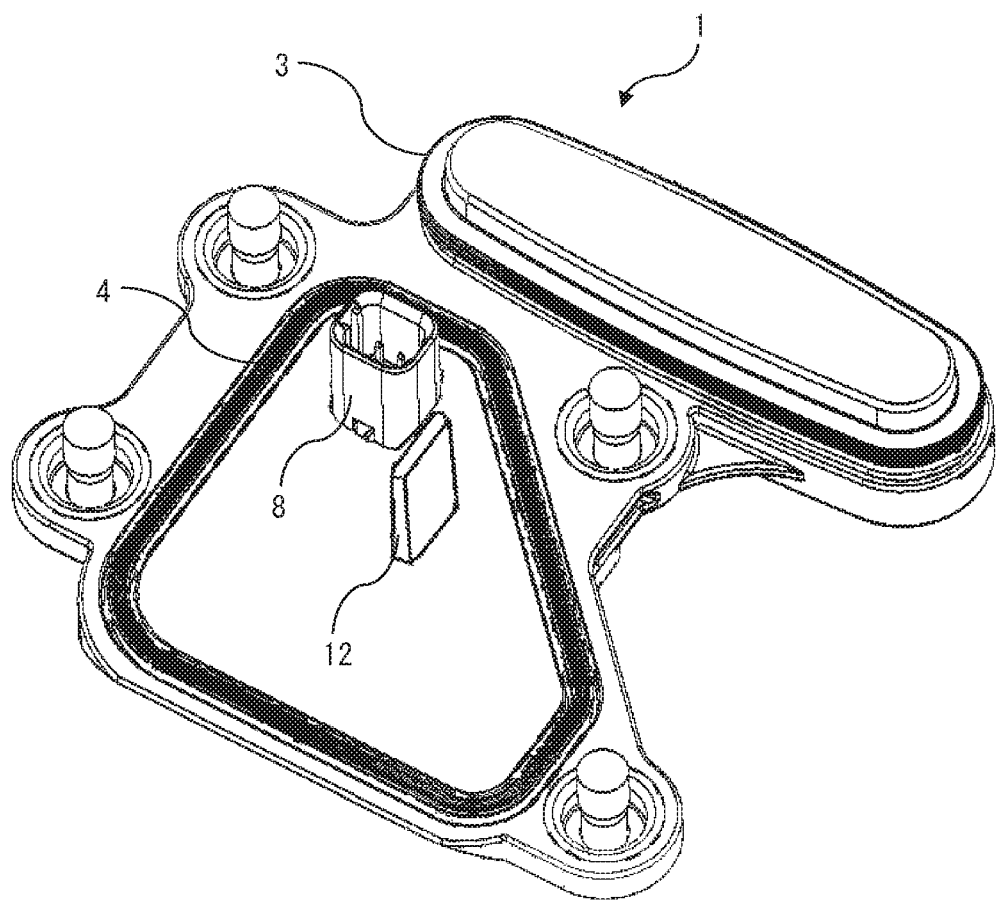
FIG. 8 is a perspective view of the outer appearance of a casing lid of a power conversion device according to a second embodiment.

A power conversion device 100 according to a second embodiment will be described. FIG. 8 is a perspective view of the outer appearance of a casing lid 1, as seen from the back side of FIG. 3. The power conversion device 100 according to the second embodiment has a configuration in which a projection 12 is provided in addition to the components of the casing lid 1 of the power conversion device 100 described in the first embodiment.

As shown in FIG. 8, the casing lid 1 includes the projection 12 located, on the side of the casing lid 1 on which the opening portions 7 are covered, between the casing lid 1 and the signal wire female connector 10 which is the terminal on the surface seal opening portion 7b side on which the surface seal 4 is provided. The projection 12 is formed by resin molding so as to be integrated with the casing lid 1. The position of the projection 12 corresponds to the position of the signal wire female connector 10 which is to be detached from the signal wire female connector retaining portion 11 in connection work to the outside, and which has not yet been connected to the outside but is retained by the signal wire female connector retaining portion 11. The casing 2 includes the signal wire female connector 10 retained by the signal wire female connector retaining portion 11 on the surface seal opening portion 7b side before the connection work. FIG. 2 shows the inside of the surface seal opening portion 7b before the connection work, and the signal wire female connector 10 is retained by the signal wire female connector retaining portion 11. If the work of attaching the casing lid 1 is performed in a state where the connection work has not been performed, the projection 12 and the signal wire female connector 10 interfere with each other, and thus the casing lid 1 cannot be attached to the casing 2. Whether the connection work between the signal wire female connector 10 and the outside has been completed can be determined based on the interference between the projection 12 and the signal wire female connector 10.

As described above, in the power conversion device 100 according to the second embodiment, the casing lid 1 includes the projection 12 at the position, on the side where the opening portions 7 are covered, that corresponds to the position of the signal wire female connector 10 which has not yet been connected to the outside. Accordingly, whether the connection work between the signal wire female connector 10 and the outside has been completed can be determined based on the interference between the projection 12 and the signal wire female connector 10. Therefore, the connection work can be prevented from being forgotten to be performed.

Third Embodiment

Figure 9:
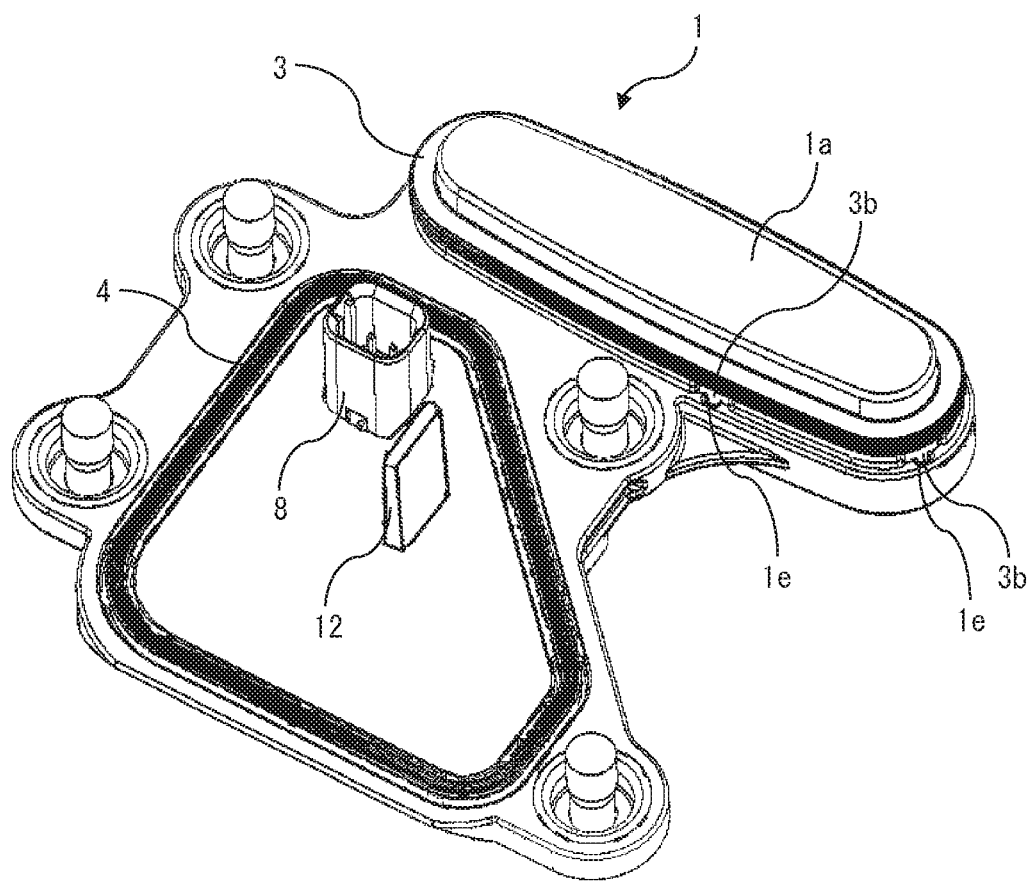
FIG. 9 is a perspective view of the outer appearance of a casing lid of a power conversion device according to a third embodiment.
Figure 10:
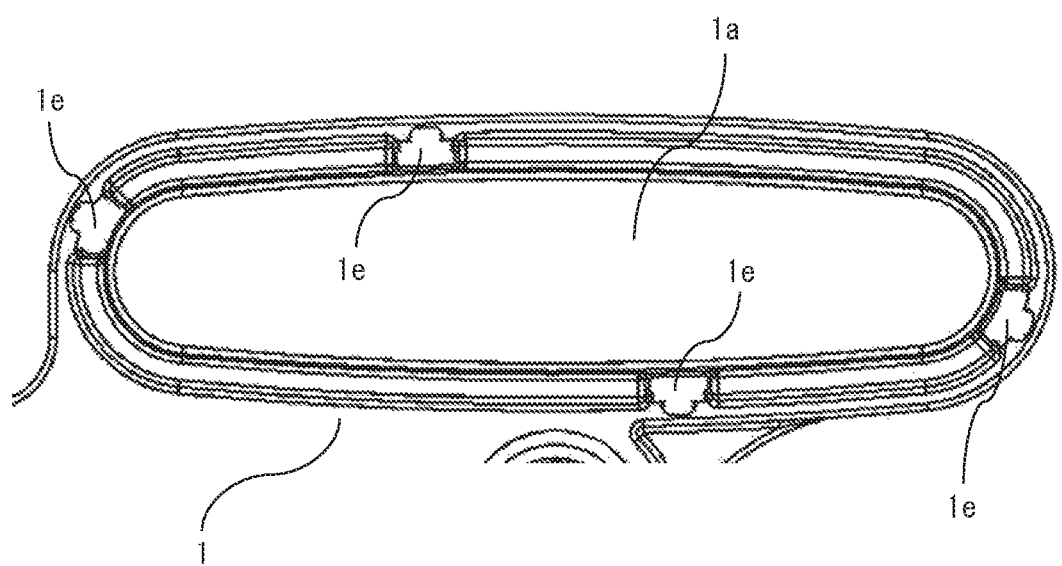
FIG. 10 is a plan view of the outer appearance of a part of the casing lid of the power conversion device according to the third embodiment.
Figure 11:
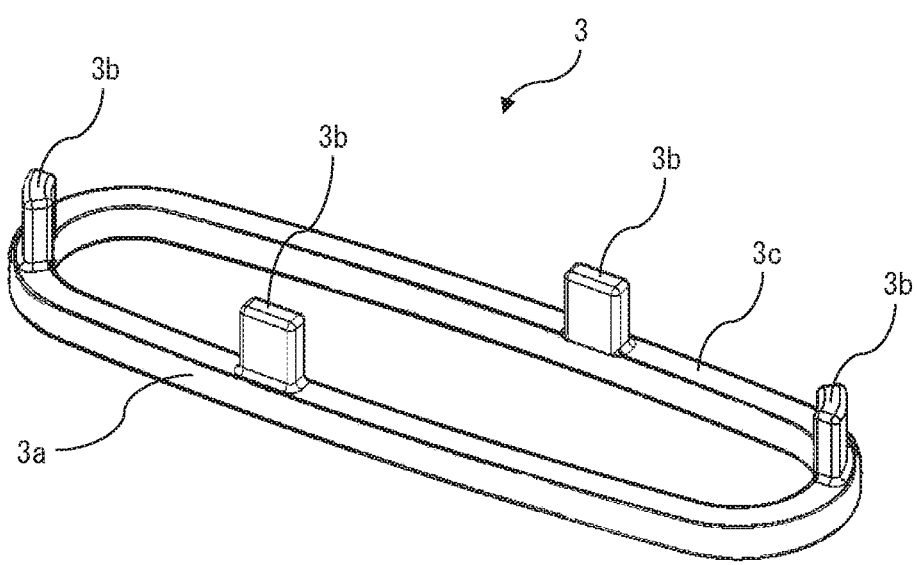
FIG. 11 is a perspective view of the outer appearance of a shaft seal of the power conversion device according to the third embodiment.

A power conversion device 100 according to a third embodiment will be described. FIG. 9 is a perspective view of the outer appearance of a casing lid 1, as seen from the back side of FIG. 3. FIG. 10 is a plan view of the outer appearance of a part of the casing lid 1 from which a shaft seal 3 of the power conversion device 100 has been removed. FIG. 11 is a perspective view of the outer appearance of the shaft seal 3 of the power conversion device 100. The power conversion device 100 according to the third embodiment has a configuration in which protrusions 3b are provided to the shaft seal 3 in addition to the components of the casing lid 1 of the power conversion device 100 described in the second embodiment.

As shown in FIG. 11, the shaft seal 3 includes the protrusions 3b to be fitted to shaft seal retaining holes 1e which are holes formed in the shaft seal mounting portion 1a of the casing lid 1. The shaft seal 3 includes four protrusions 3b on a flat surface 3c thereof that faces the casing lid 1 when the shaft seal 3 and the shaft seal mounting portion 1a are fitted to each other. The number of protrusions 3b is not limited thereto. For example, the number of protrusions 3b may be increased. The protrusions 3b are integrated with the shaft seal 3 when the shaft seal 3 is formed. As shown in FIG. 10, the shaft seal retaining holes 1e are formed in the base of the shaft seal mounting portion 1a. The shaft seal retaining holes 1e are integrally formed in the casing lid 1 when the casing lid 1 is formed. As shown in FIG. 9, the shaft seal 3 is attached to the shaft seal mounting portion 1a by fitting the protrusions 3b and the shaft seal retaining holes 1e to each other. If the shaft seal retaining holes 1e and the protrusions 3b are fitted to each other in a lightly press-fitted state, the shaft seal 3 can be left on the casing lid 1 side when the casing lid 1 is attached to or detached from the casing 2. Even if the work of attaching or detaching the casing lid 1 is performed a plurality of times, the work of attaching the shaft seal 3 to the shaft seal mounting portion 1a does not occur every time of the attaching or detaching work. Thus, the workability of assembling the power conversion device 100 is improved.

As described above, in the power conversion device 100 according to the third embodiment, the shaft seal 3 includes the protrusions 3b to be fitted to the shaft seal retaining holes 1e formed in the casing lid 1. Accordingly, the workability of assembling the power conversion device 100 is improved, and the time for the assembling work can be shortened.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 casing lid
1a shaft seal mounting portion 1b surface seal mounting portion
1c bush insert molding portion
1e shaft seal retaining hole
2 casing
2a AC load terminal
2b internal thread portion
2c counterbore
3 shaft seal
3a side surface
3b protrusion
3c flat surface
4 surface seal
4a flat surface
5 screw
5a rolled portion
5b non-rolled portion
5c head portion
6 bush
6a hole
6b level portion
6c side surface portion
7 opening portion
7a shaft seal opening portion
7b surface seal opening portion
7c side surface
7d surface seal mounting surface
8 interlock connector
8a housing portion
8b terminal
9 interlock female connector
10 signal wire female connector
11 signal wire female connector retaining portion
12 projection
100 power conversion device

What is claimed is:

1. A power conversion device comprising:
an electrical component;
a casing enclosing the electrical component and terminals connected to the electrical component and an outside, the casing having opening portions in which the terminals are disposed; and
a casing lid covering the opening portions, and including bushes integrated with the casing lid and screws for attaching the casing lid to the casing,
wherein each of the screws is, at a non-rolled portion thereof between a rolled portion of the screw and a head portion of the screw, retained by a corresponding bush among the bushes, and
wherein a shaft seal provided so as to be in contact with a side surface contiguous with a rim of a first opening portion among the opening portions, and a surface seal provided so as to be in contact with a surface contiguous with a rim of a second opening portion among the opening portions, are disposed so as to be in contact with the casing lid.

2. The power conversion device according to claim 1, wherein the terminal in the first opening portion on which the shaft seal is provided is an AC load terminal.

3. The power conversion device according to claim 1, wherein the screws are arranged around the surface seal.

4. The power conversion device according to claim 1, wherein, for each of internal thread portions which are provided to the casing and to each of which a corresponding screw is fastened, a counterbore to which the rolled portion is fitted is provided at a portion contiguous with the internal thread portion.

5. The power conversion device according to claim 1, wherein the casing lid is formed by resin molding.

6. The power conversion device according to claim 1, wherein the casing lid is formed by metal sheet press working.

7. The power conversion device according to claim 1, wherein the casing lid is formed by aluminum die-casting.

8. The power conversion device according to claim 1, wherein each of the bushes is formed by metal sheet deep drawing, machining, or forging.

9. The power conversion device according to claim 1, wherein each of the bushes is made of an aluminum alloy.

10. The power conversion device according to claim 1, wherein the casing lid includes an interlock connector to be engaged with a connector provided in the second opening portion.

11. The power conversion device according to claim 10, wherein a housing portion of the interlock connector is formed by resin molding so as to be integrated with the casing lid.

12. The power conversion device according to claim 10, wherein a terminal portion of the interlock connector is insert-molded into the casing lid.

13. The power conversion device according to claim 1, wherein the casing lid includes a projection between the casing lid and the terminal in the second opening portion on which the surface seal is provided.

14. The power conversion device according to claim 1, wherein the shaft seal includes a protrusion to be fitted to a hole formed in the casing lid.

* * * * *